United States Patent
Gutala et al.

(10) Patent No.: US 8,027,186 B2
(45) Date of Patent: Sep. 27, 2011

(54) PROGRAMMING A PHASE CHANGE MEMORY

(75) Inventors: Ravi P. Gutala, San Jose, CA (US);
Ferdinando Bedeschi, Biassono (IT);
Johnny Javanifard, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 549 days.

(21) Appl. No.: 11/904,301

(22) Filed: Sep. 26, 2007

(65) Prior Publication Data
US 2009/0080241 A1    Mar. 26, 2009

(51) Int. Cl.
*G11C 11/00* (2006.01)

(52) U.S. Cl. .................................. 365/163; 365/148

(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 4,241,315 | A | * | 12/1980 | Patterson et al. ............. 330/261 |
| 5,714,902 | A | * | 2/1998 | Comer .......................... 327/346 |
| 5,912,839 | A | * | 6/1999 | Ovshinsky et al. ....... 365/185.03 |
| 6,166,670 | A | * | 12/2000 | O'Shaughnessy ............ 341/136 |
| 6,487,113 | B1 | * | 11/2002 | Park et al. ..................... 365/163 |
| 6,697,294 | B1 | * | 2/2004 | Qi et al. .................... 365/210.15 |
| 2003/0002331 | A1 | * | 1/2003 | Park et al. ..................... 365/163 |
| 2005/0141261 | A1 | * | 6/2005 | Ahn .............................. 365/148 |
| 2005/0180083 | A1 | * | 8/2005 | Takahara et al. .............. 361/152 |
| 2006/0220071 | A1 | * | 10/2006 | Kang et al. .................... 257/248 |
| 2006/0274574 | A1 | * | 12/2006 | Choi et al. .................... 365/163 |

* cited by examiner

*Primary Examiner* — Richard Elms
*Assistant Examiner* — Harry Byrne
(74) *Attorney, Agent, or Firm* — Trop, Pruner & Hu, P.C.

(57) ABSTRACT

A programming circuit of a phase change memory cell includes a controllable current generator to supply a programming pulse and an internal control unit coupled to the controllable current generator for stepwise modifying the programming pulse. The internal control unit, in turn, includes a control signal generator to provide the controllable current generator with a plurality of control signals. An oscillator provides a time reference signal and a driving module drives the control signal generator based on the time reference signal. As a result, a programming pulse with stepwise adjustable slope can be produced, including such a pulse with different leading and trailing edges.

14 Claims, 6 Drawing Sheets

PROGRAMMING A PHASE CHANGE MEMORY

BACKGROUND

The present invention relates to a programming circuit of a phase change memory cell and to a method for programming a phase change memory cell.

As is known, phase change memories use a class of materials that have the property of switching between two phases having distinct electrical characteristics, associated with two different crystallographic structures of the material: an amorphous, disorderly phase, and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te (Ge2Sb2Te5), also called GST, which is now widely used for storing information on overwritable disks and has been also proposed for mass storage.

In chalcogenides, the resistivity varies by two or more orders of magnitude when the material passes from the amorphous (more resistive) phase to the crystalline (more conductive) phase, and vice versa.

BRIEF DESCRIPTION OF THE DRAWINGS

For the understanding of the present invention, some embodiments thereof will be now described, purely as non-limitative examples, with reference to the enclosed drawings, wherein.

DETAILED DESCRIPTION

Figure 1:
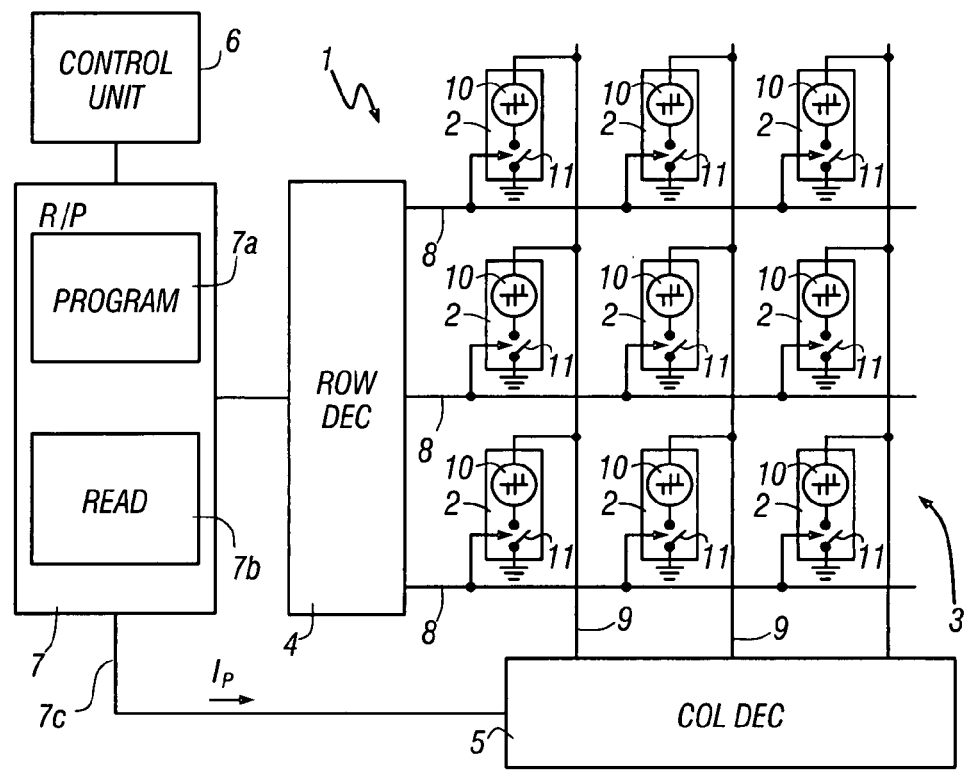
FIG. 1 is a simplified block diagram of a phase change memory device.

FIG. 1 shows a phase change memory ("PCM" hereinafter) device 1. A plurality of PCM cells 2 are arranged in rows and columns to form an array 3. A row decoder 4 and a column decoder 5 are coupled to a memory control unit 6 and to a read/program unit 7, which includes a program circuit 7a and a read/verify circuit 7b. Word lines 8 and bit lines 9 run parallel to rows and columns, respectively, and are selectively connectable to the read/program unit 7 through the row decoder 4 and the column decoder 5, in a known manner. Other arrangements may also be used.

Each PCM cell 2 is connected at a cross-point of a respective word line 8 and a respective bit line 9 and includes a storage element 10, of the phase change type, and a selection element 11. The storage element 10 has a first terminal connected to the respective bit line 9 and a second terminal connected to a first terminal of the selection element 11. The selection element 11 has a second terminal grounded and a control terminal connected to the respective word line 8. According to alternative solutions, the storage element 10 and the selection element 11 of each PCM cell 2 may be exchanged in position; moreover, the selection elements 11 may have two terminals only (e.g. diodes). Other arrangements may also be used.

The program circuit 7a is configured to provide programming currents IP to program selected PCM cells 2 into their set or reset states, under control of the memory control unit 6, as described below. For this purpose, a current output 7c of the program circuit 7a is coupled to the column decoder 5. The read/verify circuit 7b is connected to the selected PCM cells 2 for reading the information stored therein (e.g., after each programming pulse). In one embodiment, the read/verify circuit 7b is configured to carry out current reading of the PCM cells 2. In practice, output currents of PCM cells 2 are compared to appropriate read current reference levels (conventional reading) or program current levels (verify operation).

Figure 2:
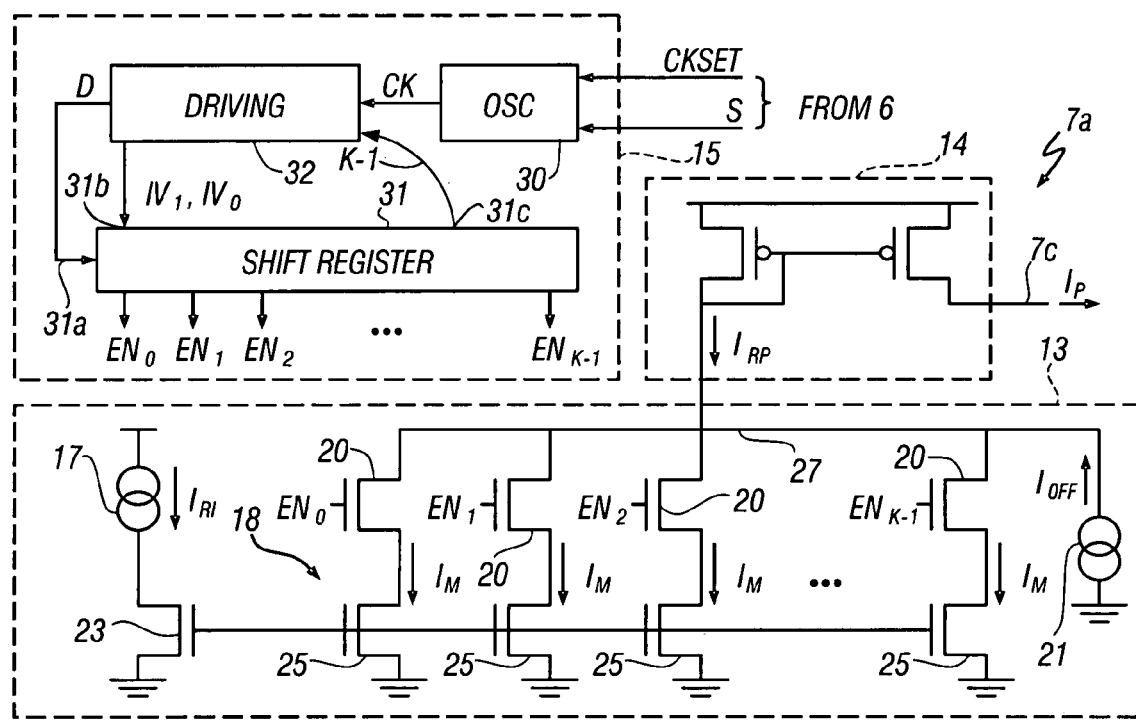
FIG. 2 is a hybrid circuital and block diagram of a programming circuit according to one embodiment of the present invention, incorporated in the phase change memory device of FIG. 1.

The program circuit 7a, that is illustrated in detail in FIG. 2, comprises a controllable current generator 13, an output stage 14 and an internal control unit 15. Other program circuits may also be used.

The controllable current generator 13 in turn may include a reference current source 17, supplying an internal reference current $I_{RI}$, a multiple-output current mirror 18, a plurality of selecting switches 20 and an offset current source 21.

The reference current source 17 feeds an input transistor 23 of the multiple-output current mirror 18. In the present embodiment, the reference current source 17 is a band-gap current source, that is independent of temperature.

As another example, the reference current source 17 may be a temperature sensitive current source, with negative temperature coefficient (NTC). Hence, a higher internal reference current $I_{RI}$ is provided when the operating temperature is lower and greater heat is being supplied.

The input transistor 23 may be a diode-connected NMOS transistor with source terminal grounded and a drain terminal connected to the reference current source 17 to sense the internal reference current $I_{RI}$ in one embodiment. The multiple-output current mirror 18 may include a plurality of output transistors 25 that may be NMOS transistors identical to one another in one embodiment. Source terminals of the output transistors 25 may be grounded, whereas respective gate terminals thereof may be directly connected to the gate terminal of the input transistor 23. In the embodiment herein described, thirty two output transistors 25 are provided.

The controllable current generator 13 may include as many selecting switches 20 as output transistors 25 in one embodiment. In the embodiment herein described, selecting switches 20 are NMOS transistors having source terminals coupled to drain terminals of respective output transistors 25; and drain terminals coupled to a common current addition node 27. Control signals EN0, EN1, . . . , ENK−1, generated by the internal control unit 15, may be provided on gate terminals of respective selecting switches 20, for selectively coupling the output transistors 25 to the current addition node 27. If the output transistors 25 are identical and connected in current mirror configuration with the input transistor 13, equal mirrored reference currents $I_M$ are supplied, when the respective selecting switches 20 are closed.

The offset current source 21 may be connected to the current addition node 27 to supply an offset current $I_{OFF}$, that is summed to the mirrored reference currents $I_M$ flowing through the selected output transistors 25 to form a programming reference current $I_{RP}$.

The current addition node 27 is connected to the output stage 14 that may include a single-output PMOS current mirror and is configured to provide the programming current $I_P$ by mirroring the programming reference current $I_{RP}$. An output terminal of the output stage 14 forms the output current 7c of the program circuit 7a.

The internal control unit 15 may be dedicated to operate the controllable current generator 13 and may comprise an oscillator 30, a shift register 31 and a driving module 32.

The oscillator 30, e.g. a ring oscillator, may have an adjustable oscillation frequency. The oscillator 30 may be controlled by the memory control unit 6 (FIG. 9) to provide a clock signal CK during programming operations. For this purpose, the oscillator 30 receives a start/stop signal S and a clock set signal CKSET from the memory control unit 6, to adjust the oscillation frequency and hence the frequency of the clock signal CK. In one embodiment, in response to a first value of the start/stop signal S, the oscillator is activated and supplies the clock signal CK with a frequency that is determined by the clock set signal CKSET. When the start/stop signal S switches to a second value, the oscillator 30 is deactivated.

The shift register 31 has K bits and K respective output terminals, which are connected to gate terminals of K respective selecting switches 20. The shift register 31 may be operated as a control signal generator that supplies the control signals EN0, EN1, . . . , ENK−1. More precisely, the control signals EN0, EN1, . . . , ENK−1 may be provided on respective output terminals of the shift register 31. The shift register 31 has a shift input 31a, coupled to the driving module 32 for receiving a driving signal D. The driving signal D is generated by the driving module 32 based on the clock signal CK, as described below. The driving module 32 also provides a first input value IV1 and a second input value IV0 at a first end-position bit 31b of the shift register 31. In the present embodiment, the first input value IV1 is "1" and is supplied in a first operating condition; and the second input value IV0 is "0" and is supplied in a second operating condition. A control signal EK−1, corresponding to a second end-position bit 31c of the shift register 31, is supplied to the driving module 32 and used to generate the driving signal D.

Figure 3:
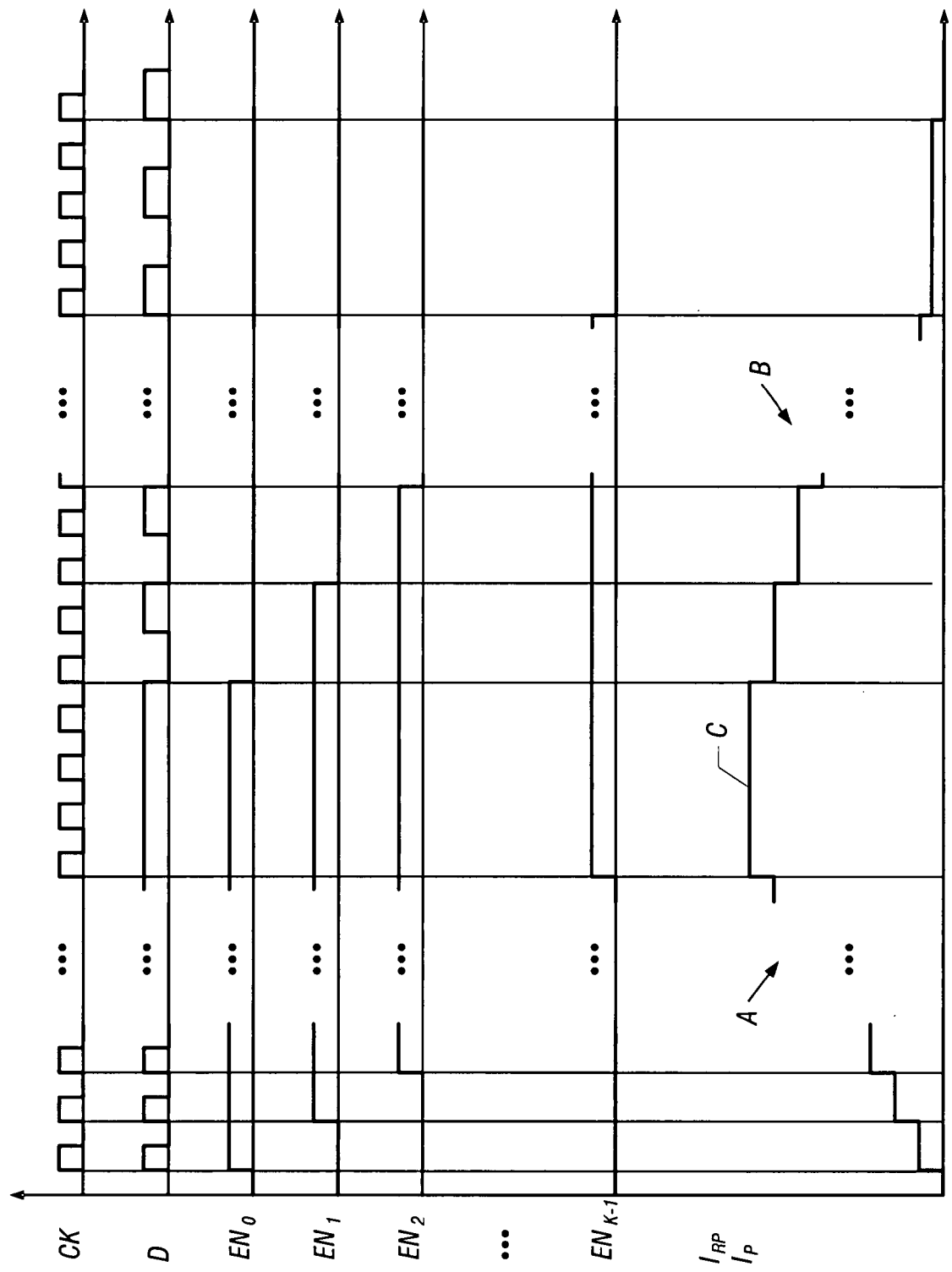
FIG. 3 is a graph showing quantities relating to the programming circuit of FIG. 2.

The shift register 31 is initialized by loading a "0" value at each position thereof. Then, the shift register 31 is driven through the control signals EN0, EN1, . . . , ENK−1 so that the controllable current generator 13 supplies a staircase programming current pulse $I_{RP}$ with differently sloping leading edge A and trailing edge B, as illustrated in FIG. 3.

Bit values stored in the shift register 31 are shifted by one position at every cycle of the driving signal D (e.g. at leading edges). Moreover, the one of the first input value IV1 and the second input value IV0 ("1"), that is presented by the driving module 32 in this step, is loaded at the first end-position bit 31b and, following a shift, the bit value at the second end-position bit 31c is eliminated. Hence, at every cycle of the driving signal D, one of the control signals EN0, EN1, . . . , ENK−1 switches, whereas the others remain at their previous values. One of the selecting switches 20 is then closed (or opened, depending on whether the corresponding control signal EN0, EN1, . . . , ENK−1 has changed from "0" to "1" or from "1" to "0", respectively) and the respective output transistor 25 is turned on (off, respectively), thereby increasing (decreasing, respectively) the programming reference current $I_{RP}$ by a step equal to the mirrored reference current $I_M$.

When the oscillator 30 is started by the memory control unit 6 through the start/stop signal S, the driving module is supplied with the clock signal CK. As above indicated, the oscillator 30 may be also controlled through the clock set signal CKSET to adjust the frequency of the clock signal CK. The driving module 32 initially supplies the shift register 31 with the first input value IV1 and operates to generate the driving signal D with a first frequency (that is the same frequency of the clock signal CK, in the present embodiment). Accordingly, one output transistor 25 is turned on at every cycle of the clock signal CK. When all the output transistors 25 have been turned on, the shift register 31 may be prevented from changing its configuration by holding the driving signal D at a constant value for a number of cycles of the clock signal CK. Thus, the programming current $I_{RP}$ is maintained at its highest level C during the same time interval.

Then, the driving module 32 loads the second input value IV0 ("0") at the first end-position bit 31b of the shift register 31. The driving signal D is controlled to switch with a second frequency, that is lower than the first frequency. More precisely, in the embodiment herein described, a switching cycle of the driving signal D is completed every two cycles of the clock signal CK, so that the second frequency of the driving signal D is half the first frequency.

At every cycle of the driving signal D, the content of the shift register 31 is shifted by one position and one of the control signals EN0, EN1, . . . , ENK−1 switches to "0", thereby turning off the corresponding output transistor 25. Thus, the programming current pulse $I_{RP}$ is stepwise decremented by an amount equal to the mirrored reference current $I_M$, until all the output transistors 25 have been turned off.

The average slope of the trailing edge B is different (lower) than the average slope of the leading edge A and may be separately and independently controlled in some embodiments. While a trapezoidal pulse is illustrated, other shapes may also be used, including a triangular pulse.

Then, only the offset current $I_{OFF}$ determines the programming current pulse $I_{RP}$ in a terminal interval (e.g. a predetermined number of cycles of the clock signal CK) in one embodiment. Once the terminal interval has expired, the memory control unit 6 deactivates the oscillator 30 and terminates the program step.

In some embodiments, the program circuit 7a advantageously provides for fine and flexible control of slopes of leading and trailing edges of program current pulses, without increasing the workload of the memory control unit 6. In addition, very few signal lines are required to bring control signals from the memory control unit 6 to the program circuit 7a, that results in reduced device dimensions in one embodiment.

Figure 4:
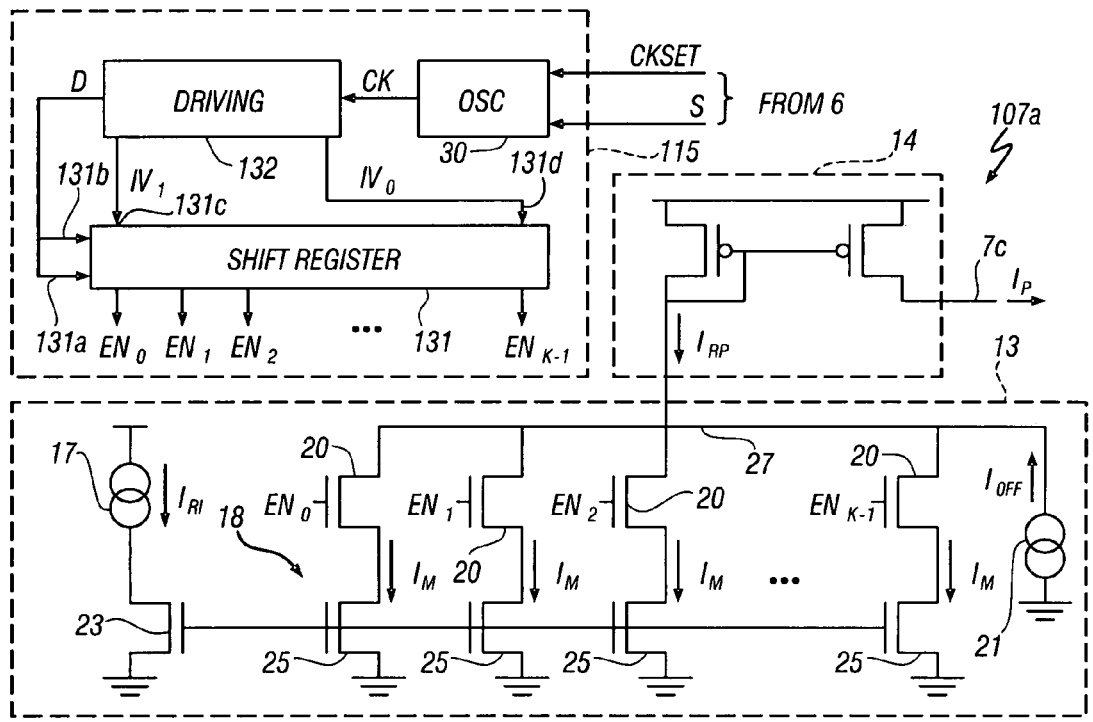
FIG. 4 is a hybrid circuital and block diagram of a programming circuit according to another embodiment of the present invention.
Figure 5:
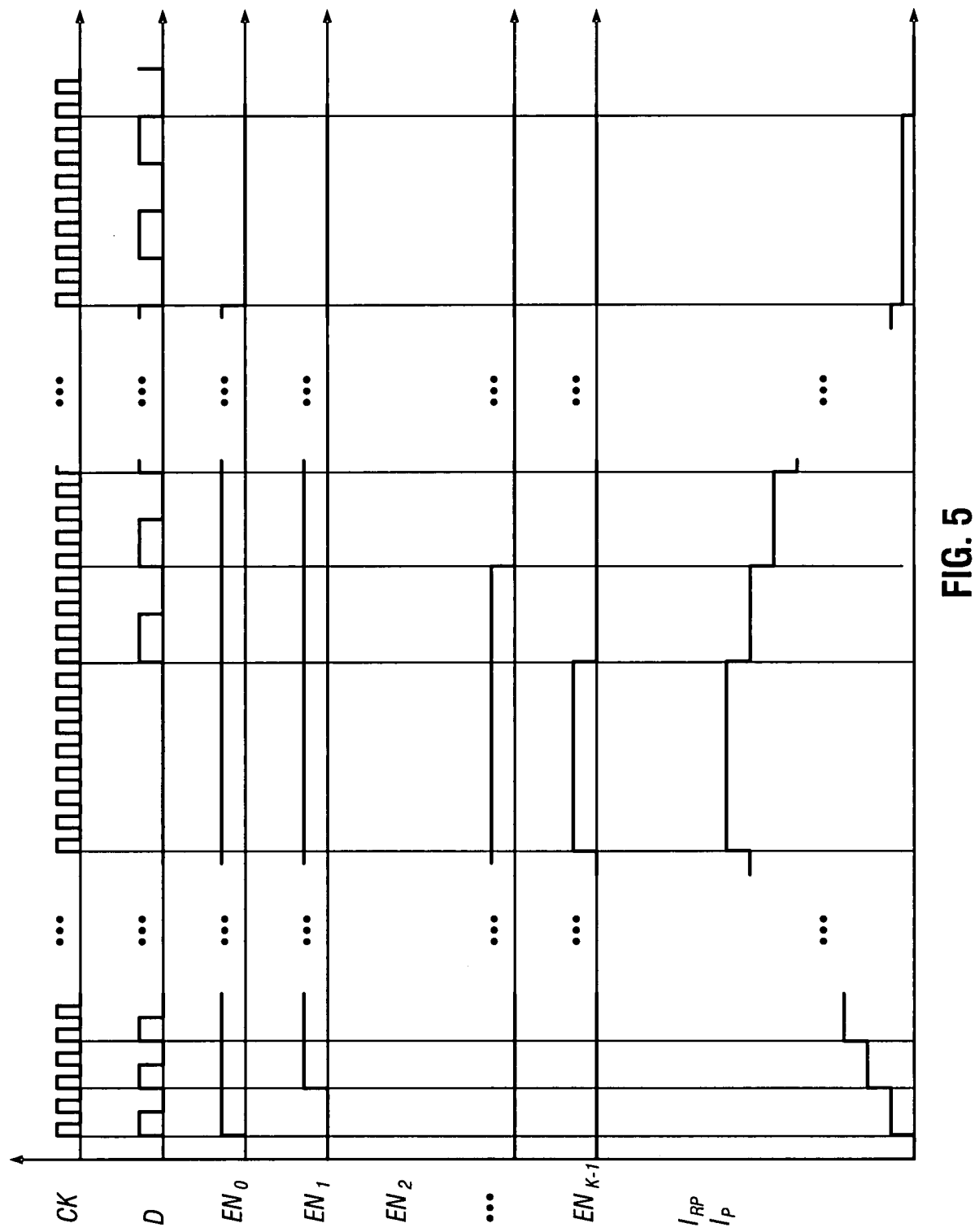
FIG. 5 is a graph showing quantities relating to the programming circuit of FIG. 4.

Another embodiment is illustrated in FIGS. 4 and 5, wherein parts already illustrated are indicated by the same reference numbers. In this embodiment, a program circuit 107a comprises the controllable current generator 13, the output stage 14 and an internal control unit 115, which in turn includes the oscillator 30, a bidirectional shift register 131 and a driving module 132.

The shift register 131 has at least as many bits as the output transistors 25 of the controllable current generator 13 (K=32 in the present embodiment). Outputs of the shift register 131 provide the control signals EN0, EN1, . . . , ENK−1 for controlling respective output transistors 25. The driving circuit 32 supplies the driving signal D at right and left shift inputs 131a, 131b of the shift register 131, and, at a direction input 131c, a shift direction signal L/R, by which the shift register 131 is controlled to shift its content either right or left. The driving circuit 32 furthermore provides the first input value IV1 at a first end position bit 131c of the shift register 131, the second input value IVo at a second end-position bit 131d of the shift register 131.

As shown in FIG. 5, the driving signal D has a first frequency until all of the output transistors 25 are activated, then it is maintained at a constant level for a predetermined number of cycles of the clock signal CK. Afterwards, the driving module 132 supplies the driving signal D with a second frequency, lower than the first frequency. In particular, the first frequency and the second frequency are respective fractions 1/M and 1/N of the frequency of the clock signal CK (M and N are integer numbers, with N>M). In the embodiment herein described, the ratio between the first frequency and the second frequency is 2 (M=2, N=4). In the embodiment of FIG. 3, with M=1 and N=2, the ratio is 2 as well; however, it is understood that the ratio may be different.

Figure 6:
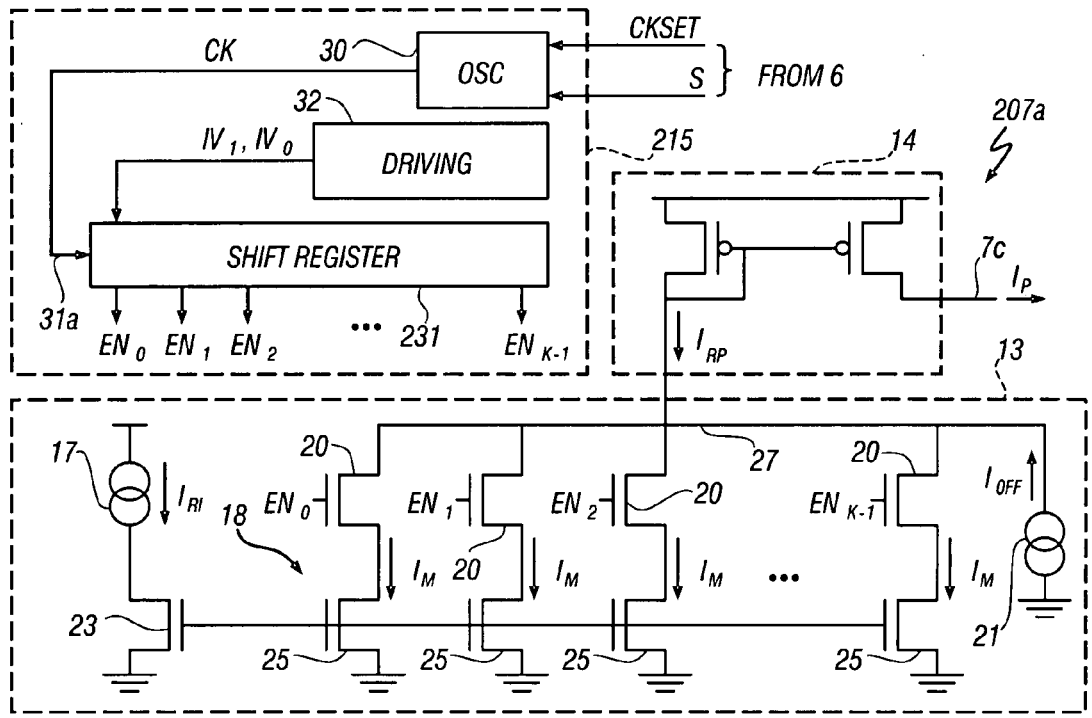
FIG. 6 is a hybrid circuital and block diagram of a programming circuit according to a further embodiment of the present invention.
Figure 7:
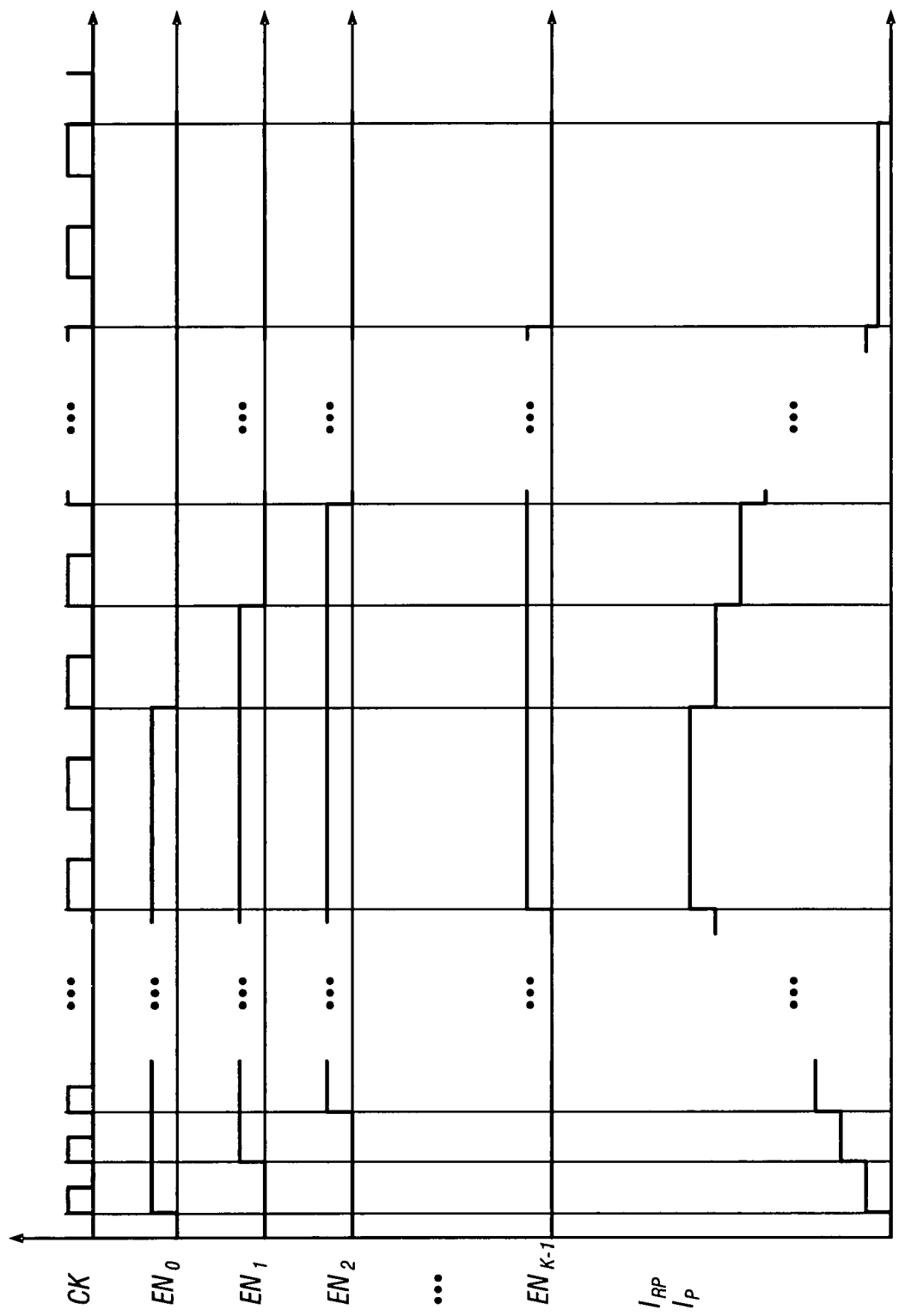
FIG. 7 is a graph showing quantities relating to the programming circuit of FIG. 6.

According to another embodiment (FIGS. 6 and 7), in an internal control unit 215 of a program circuit 207a, the oscillator 30 supplies the clock signal CK directly to a shift register 231. A driving module only provides the first input value IV1 and the second input value IVo for the shift register 231. In this case, the oscillator 230 is controlled by the memory control unit 6 through the clock set signal CKSET to oscillate with a first frequency, until the all of the output transistors 25 are activated, and afterwards with a second frequency, lower than the first frequency.

Figure 8:
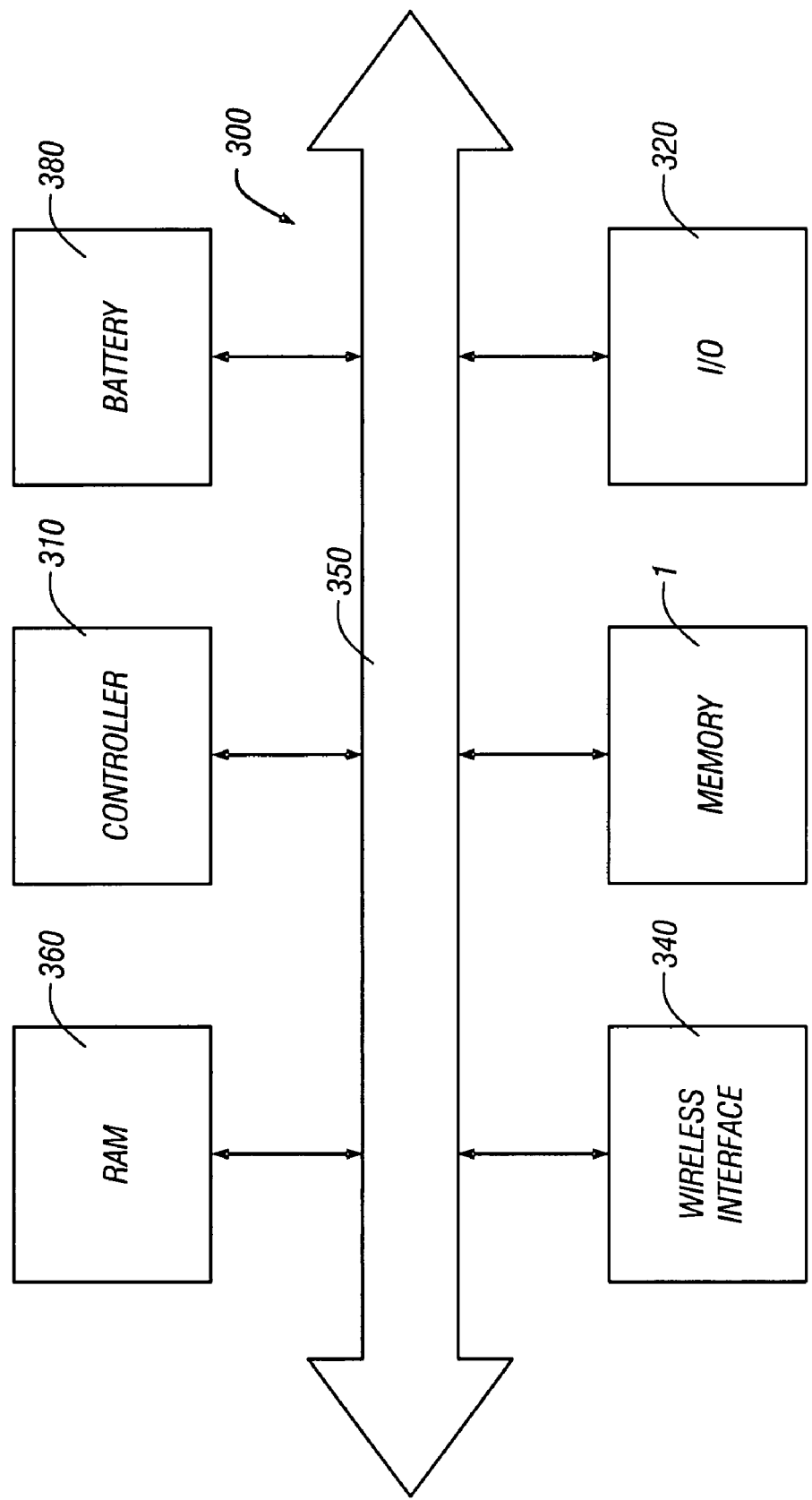
FIG. 8 is a system depiction of one embodiment of the present invention.

In FIG. 8, a portion of a system 300 in accordance with an embodiment of the present invention is illustrated. System 300 may be used in devices such as, for example, a personal digital assistant (PDA), a laptop or portable computer, possibly with wireless capability, a cell phone, a messaging device, a digital music player, a digital camera, or other devices that may be adapted to process, store, transmit or receive information and require permanent storage capability.

System 300 may include a controller 310, an input/output (I/O) device 320 (e.g. a keyboard, display), the phase-change memory device 1, a wireless interface 340, and a RAM memory 360, coupled to each other via a bus 350. A battery 380 may be used to supply power to the system 300 in one embodiment. It should be noted that the scope of the present invention is not limited to embodiments having necessarily any or all of above listed components.

Controller 310 may comprise, for example, one or more microprocessors, digital signal processors, micro-controllers, or the like.

The I/O device 320 may be used to generate a message. The system 300 may use the wireless interface 340 to transmit and receive messages to and from a wireless communication network with a radio frequency (RF) signal. Examples of the wireless interface 340 may include an antenna, or a wireless transceiver, such as a dipole antenna, although the scope of the present invention is not limited in this respect. Also, the I/O device 320 may deliver a voltage reflecting what is stored as either a digital output (if digital information was stored), or as analog information (if analog information was stored).

Finally, it is clear that numerous modifications and variations may be made to the method and the device described and illustrated herein, all falling within the scope of the invention, as defined in the attached claims. In particular, it is clear that program current pulses with a variety of shapes may be provided. For example, the ratio of the leading and trailing edges may be different to those described. Moreover, pulses may have vertical instead of sloping leading edges.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a plurality of phase change memory cells; and
   a controllable programming current generator to set the leading edge and the trailing edge of a set pulse at different slopes.

2. The memory of claim 1, said circuit including:
   a control signal generator to generate a plurality of control signals;
   an oscillator to provide a time reference signal; and
   a drive module to drive the control signal generator based on the time reference signal.

3. The memory of claim 2 wherein the control signal generator includes a plurality of selectable current sources and a plurality of selecting elements controlled by respective control signals to selectively connect one respective selectable current source to a common node.

4. The memory of claim 3 wherein the control signal generator comprises a reference current source to provide an internal reference current and an input transistor to sense the internal reference current and wherein the selectable current sources comprise respective output transistors, coupled to the input transistor to form a multiple-output current mirror.

5. The memory of claim 4 wherein each selecting element comprises a switch, connected between the common node and one respective selectable current source and having a control terminal for receiving one respective control signals.

6. The memory of claim 3 including offset current source coupled to the common node to supply an offset current.

7. The memory of claim 3 wherein the driving module to drive the control signal generator to disconnect one selectable current sources from the common node every N cycles of the time reference signal in one operative condiction, N being a first integer number.

8. The memory of claim 7, wherein the driving module to drive the control signal generator to connect one selectable current source to the common node every M cycles of the time reference signal in a further operative condition, M being a second integer number smaller than the first integer number N.

9. The memory of claim 2 wherein the control signal generator comprises a shift register.

10. The memory of claim 9 wherein the driving module to generate a driving signal, based on the clock signal and the shift register, has a shift input connected to the driving module to receive the driving signal.

11. The memory of claim 2 wherein the oscillator has an adjustable oscillation frequency.

12. The memory of claim 1, said circuit to enable the slope of a programming pulse to be selectively adjusted.

13. The memory of claim 1 wherein said current generator to produce programming pulses with stepwise adjustable slope.

14. The memory of claim 1, said current generator to selective supply different stepped programming pulses to said cells.

* * * * *

UNITED STATES PATENT AND TRADEMARK OFFICE
CERTIFICATE OF CORRECTION

Page 1 of 1

PATENT NO.        : 8,027,186 B2
APPLICATION NO.   : 11/904301
DATED             : September 27, 2011
INVENTOR(S)       : Ravi P. Gutala et al.

It is certified that error appears in the above-identified patent and that said Letters Patent is hereby corrected as shown below:

Col. 6, line 52: "...condiction..." should be --...condition...--

Signed and Sealed this
Thirteenth Day of March, 2012

David J. Kappos
*Director of the United States Patent and Trademark Office*